United States Patent [19]
Satoh

[11] Patent Number: 5,946,590
[45] Date of Patent: Aug. 31, 1999

[54] METHOD FOR MAKING BUMPS

[75] Inventor: Tetsuo Satoh, Tokyo, Japan

[73] Assignee: Citizen Watch Co., Ltd., Tokyo, Japan

[21] Appl. No.: 08/987,240

[22] Filed: Dec. 9, 1997

[30] Foreign Application Priority Data

Dec. 10, 1996 [JP] Japan ................................. 8-329496

[51] Int. Cl.[6] ........................................ H01L 21/44
[52] U.S. Cl. ........................... 438/613; 438/612; 438/614
[58] Field of Search ................................ 438/613, 612, 438/614

[56] References Cited

U.S. PATENT DOCUMENTS

| | | | |
|---|---|---|---|
| 4,950,623 | 8/1990 | Dishon | 438/615 |
| 5,137,845 | 8/1992 | Lochon et al. | 438/614 |
| 5,376,584 | 12/1994 | Agarwala | 438/615 |

Primary Examiner—Kevin M. Picardat
Assistant Examiner—Deven Collins
Attorney, Agent, or Firm—Kanesaka & Takeuchi

[57] ABSTRACT

A bump is formed on a semiconductor wafer which has a pad electrode thereon. The method includes the steps for coating a first organic film on a semiconductor water; drying the first organic film; applying an excimer laser to a portion of the first organic film substantially corresponding to the pad electrode to thereby form a first opening in the organic film; forming at least one metallic film on the first organic film and the opening; coating a second organic film on the metallic film; drying the second organic film; applying an excimer laser to a portion of the second organic film substantially corresponding to the first opening to thereby form a second opening in the second organic film; and providing and melting solder at the second opening to form a solder bump. Since the openings of the organic films are formed by the excimer laser, the openings can be formed in a short time with high accuracy. Thus, the bump with high quality can be formed at a low cost.

14 Claims, 11 Drawing Sheets

(f)

(g)

(h)

(a)

(b)

(c)

(d)

(e)

(f)

(g)

(a)

(b)

(c)

(a)

(b)

(c)

(d)

(e)

(f)

(g)

(h)

(i)

(j)

METHOD FOR MAKING BUMPS

BACKGROUND OF THE INVENTION

1. Field of the invention

The present invention relates to a method for forming a bump on a pad electrode of a semiconductor device. More specifically, the present invention relates to a method for forming a bump, which can remove a portion of an organic film by using an excimer laser and thereby form an opening.

2. Description of the related art

Conventional methods for forming a bump on a pad electrode of a semiconductor device include a metal evaporation method, an electroplating method, a stud-bumping method, an adhesive applying method, etc. However, these methods for forming a bump may destroy a passivation film because the passivation film is suffered with an excessive force by covering pinholes on the passivation film of the semiconductor wafer and by deformation of the bump with an unbalanced force. Thus, in order to prevent the destruction of the passivation film, a polyimide film has been used.

In addition, a photoresist for plating is used in forming a bump by using the electroplating method. FIG. 7 shows a process chart of a conventional method for forming a bump. The conventional method is the electroplating method using the polyimide film and the photoresist film for plating. In the illustrated process, a photo-insensitive polyimide is used. FIGS. 8(a)–8(j) show cross-sectional views of a pad electrode portion of a semiconductor wafer in the major steps shown in FIG. 7.

The conventional method for forming a bump using an electroplating method will be described with reference to these figures.

As shown in FIG. 8(a), a semiconductor wafer 1 which has a passivation film 2 and an aluminum electrode 3 thereon, is washed (S1), and then a polyimide film 10 is coated on the passivation film 2 and the aluminum electrode 3 (S2) as shown in FIG. 8(b). Thereafter, the polyimide film 10 is dried by pre-baking step(S3) and post-baking step(S4) for the polyimide film 10.

Next, a photoresist for etching(RS) is coated on the polyimide film 10 and thereby a photoresist film for etching 15 is formed (S5) as shown in FIG. 8(c). Then, common steps of the electroplating method, such as pre-baking step (S6), exposure step(S7) and developing step(S8) of the photoresist film, are carried out. Consequently, the portion of the photoresist film for etching 15 is removed as shown in FIG. 8(d) and an opening 16 is formed.

Next, post-baking step (S9) of the photoresist film for etching 15 is carried out, whereby the photoresist film 15 is dried. Thereafter, an exposed portion of the polyimide film 10 at the opening 16 of the photoresist film for plating is removed by using hydrazine in the etching process(S10), whereby an opening 11 of the polyimide as shown in FIG. 8(e) is formed. Thereafter, the photoresist film 15 is exposed with an ultra visible light, etc., whereby the photoresist film 15 is removed by a resist removing agent (S11). Thereafter, aluminum, chrome and copper is deposited onto the polyimide film 10 and the opening 11 of the polyimide by vacuum evaporation, whereby an under bump metallurgy (UBM) 4 for the bump is formed (S12) as shown in FIG. 8(f). The under bump metallurgy 4 also has the function of the common electrode of electroplating.

Next, a photoresist is coated on the under bump metallurgy 4, whereby a photoresist film for plating 20 is formed (S13) as shown in FIG. 8(g). Then, pre-baking step(S14), exposure step(S15) and developing step(S16) of the photoresist for plating 20 are carried out. Consequently, the portion of the photoresist for plating 20 is removed as shown in FIG. 8(h), whereby an opening 21 of the photoresist for plating is formed. Then, post-baking step of the photoresist for plating 20 is carried out (S17).

Next, the above processed semiconductor wafer is attached to a plating unit (no illustration) (S18), then plating of copper 30 (S19) and plating of solder 40 (S20) are carried out with pre-determined thickness respectively. Thereafter, the photoresist for plating 20 is removed by a resist removing agent (S21) and the unnecessary under bump metallurgy 4 is removed by etching with a solder 40 as an etching mask (S22). Thereafter, a flux is applied on plated solder 40 (S23), and then the solder 40 is melted in a reflow furnace under a nitrogen atmosphere, whereby a spherical shaped solder bump 41 is obtained as shown in FIG. 8(j). Thereafter, an inspection is carried out and a process for forming a solder bump 41 is completed.

However, this method for forming a solder bump by using an electroplating method has the problems as follows.

First, after the post-baking step of the polyimide, the residue (scum) of polyimide (i.e. ultra thin film) is left on the aluminum electrode in the periphery of the opening 11 of the polyimide film. The residue of polyimide can not be removed in the developing step. As a result, the opening 11 of the polyimide with a predetermined size can not be obtained and the quality of the bump becomes worse. Especially, when the size of the opening 11 of the polyimide is 40 μm or less, the residue of polyimide can not be ignored and thereby a plasma dry etching is needed in order to remove the residue of polyimide.

Second, six steps for forming the opening 11 of the polyimide, such as the photoresist coating step (S5) through the photoresist post-baking step (S9) and the photoresist removing step, and two steps for forming the opening 21 of the photoresist for plating, such as, the photoresist for plating pre-baking step (S14) and the photoresist for plating exposure step, are necessary and therefore it takes a long time to complete the process.

Third, because of the forgoing first and second problems, the process time becomes long and the process cost becomes also expensive.

SUMMARY OF THE INVENTION

The object of the present invention is to provide a method for forming a bump capable for removing an organic film and thereby forming an opening with high accuracy in a simple process.

The present invention provides a method for forming a bump on a semiconductor wafer which has a pad electrode thereon, comprising;

a step for coating an organic film on the semiconductor wafer directly or indirectly, a step for drying the organic film, and a step for forming an opening by removing a portion of the organic film substantially corresponding to the pad electrode, with an excimer laser. Then, solder is applied to the opening and is then melted to form a solder bump.

The present invention also provides a method for forming a bump on a semiconductor wafer which has a pad electrode thereon, comprising;

a step for coating the first organic film on the semiconductor wafer, a step for drying the first organic film; a step for forming an opening by removing a portion of the first organic film substantially corresponding to the pad electrode, with an excimer laser, a step for forming at least one metallic film on the first organic film and the opening, a step for coating the second organic film on the metallic film, a step for drying the second organic film, and a step for forming the second opening by removing a portion of the second organic film substantially corresponding to the opening, with an excimer laser. Then, solder is applied to the second opening and is then melted to form a solder bump.

DETAILED DESCRIPTION OF THE PREFERRED EMBODIMENT

The embodiments of the present invention are explained below. However, the following description merely exemplifies the embodiments of the present invention, and therefore the scope of the present invention is not limited to the following description without special reasons.

Embodiment 1

The method for forming a bump of Embodiment 1 is described with reference to FIG. 1 and FIGS. 2(a)–2(h).

Figure 1:
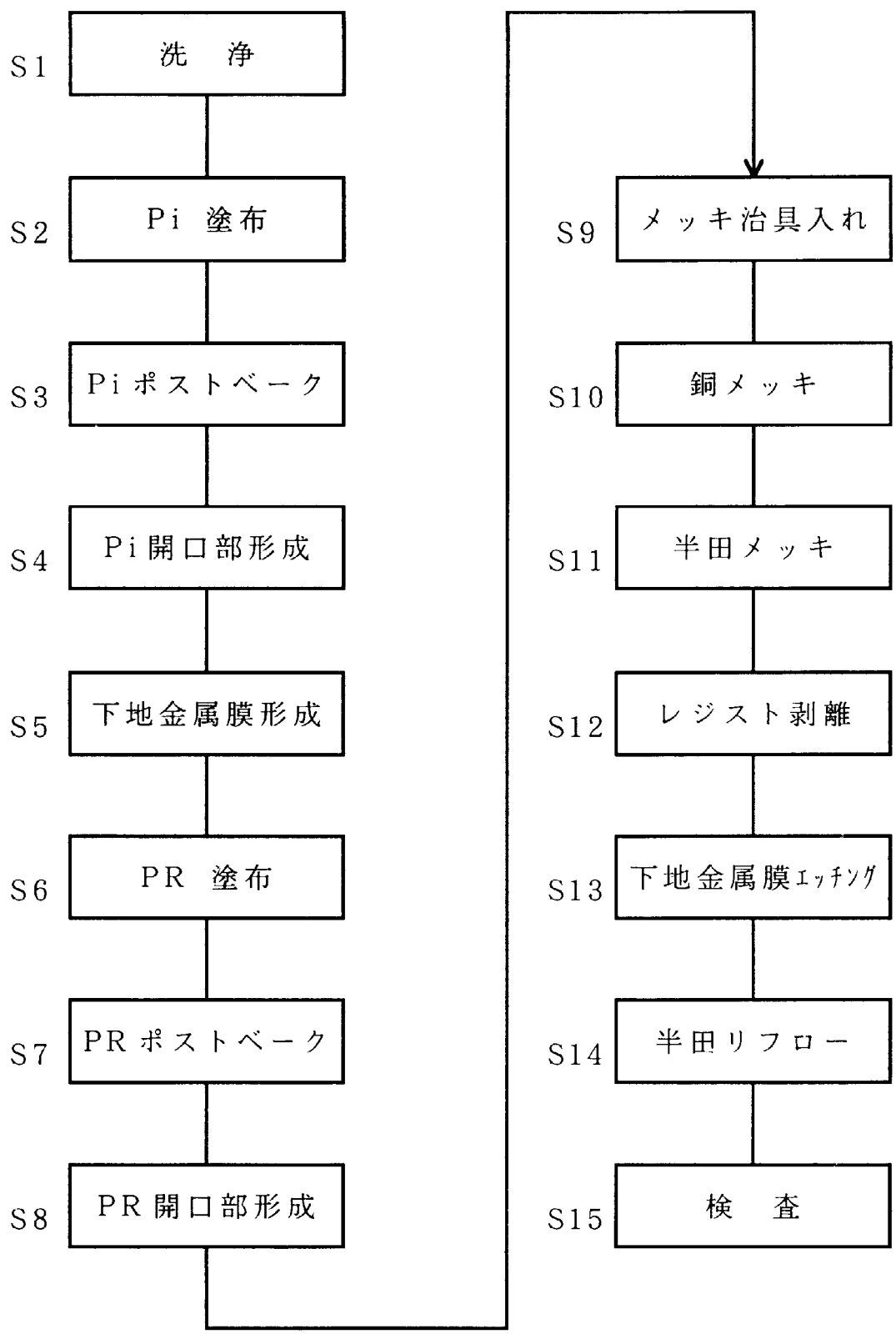
FIG. 1 shows a process chart of the method for forming a bump of Embodiment 1.
Figure 2:
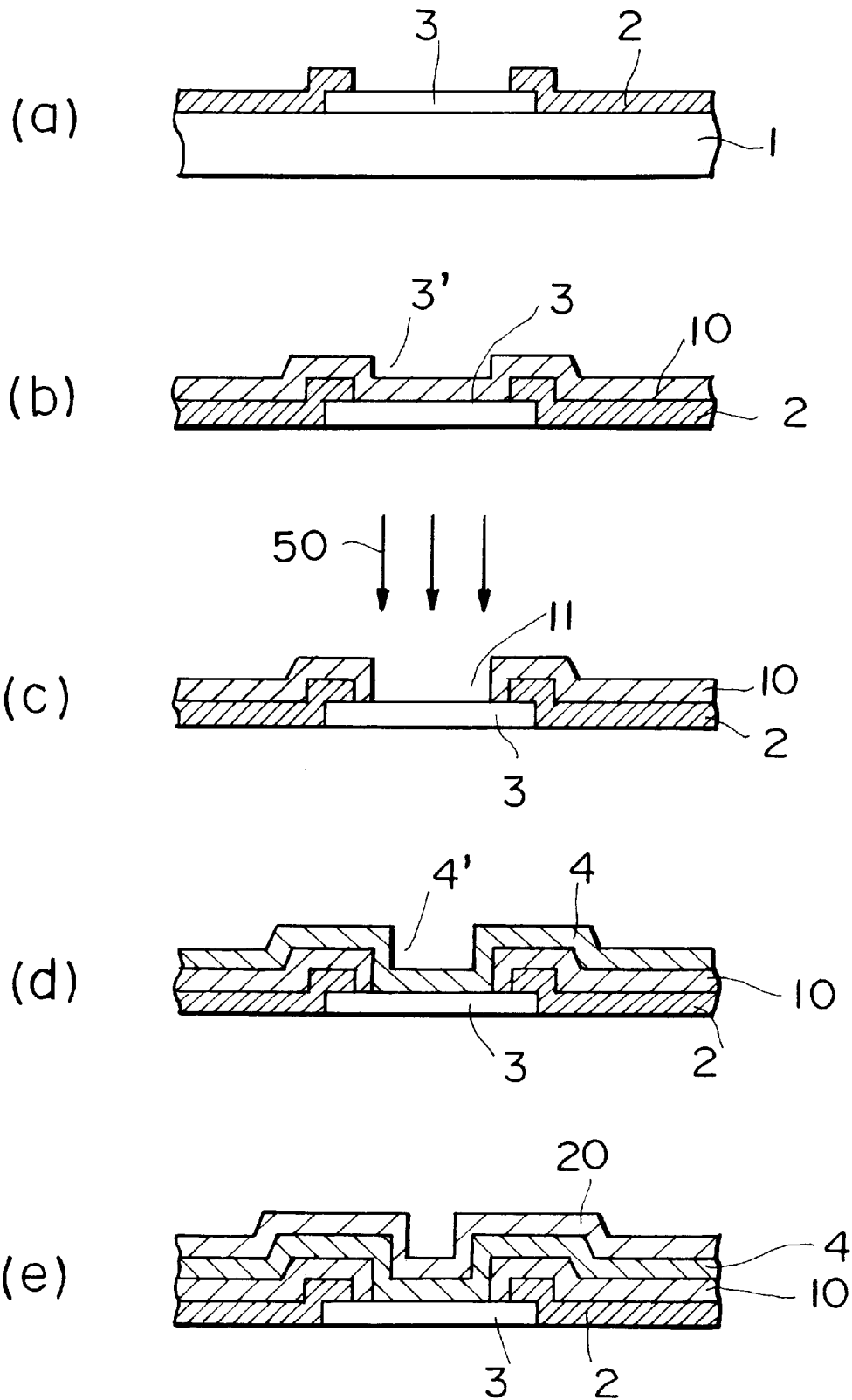
FIG. 2(a) through (h) show cross sectional views of bump forming portions of the major steps in FIG. 1.
Figure 2:
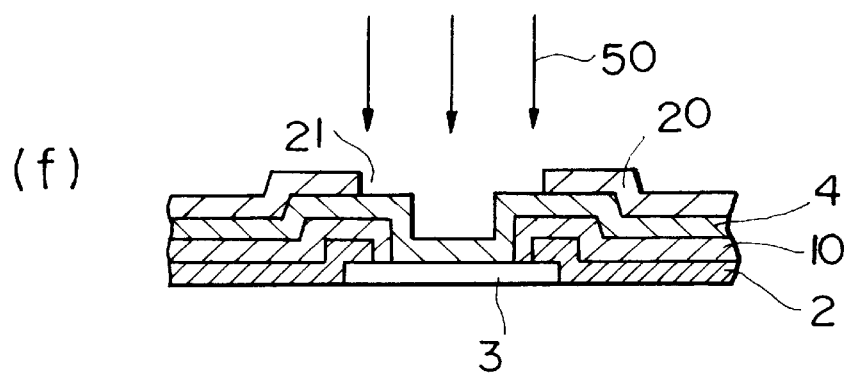
Figure 2:
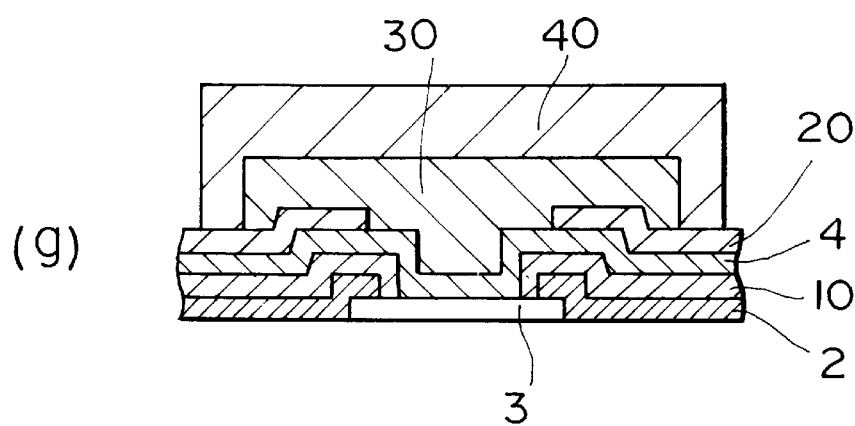
Figure 2:
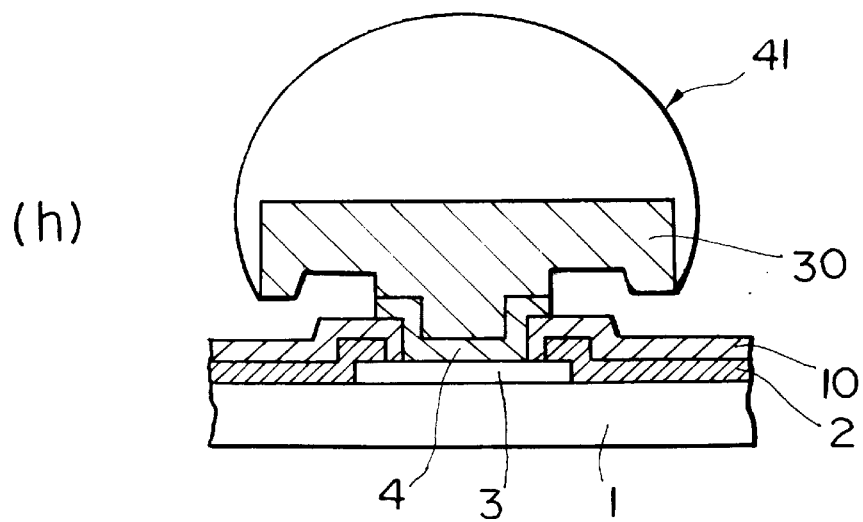
Figure 3:
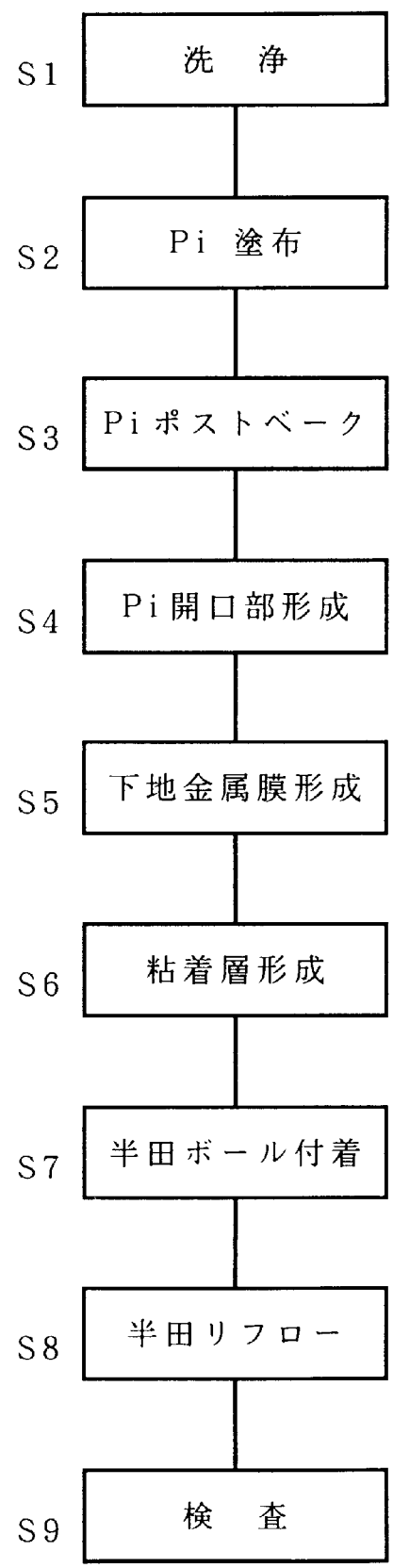
FIG. 3 shows a process chart of the method for forming a bump of Embodiment 2.

In the washing step (S101), the semiconductor having a passivation film 2 and an aluminum electrode 3 thereon as shown in FIG. 2(a) is washed in order to form a bump thereafter.

In the polyimide coating step (S102), a polyimide film 10 is formed by using spinner as shown in FIG. 2(b) which has the functions of a cushion against a force applied to a bump and for covering pinholes in the passivation film 2. Thereafter, in the polyimide post-baking step (S103), a heat treatment at 350° C. for 30 min. is carried out in order to obtain the completely cured polyimide film 10. Consequently, a whole surface of the semiconductor device is covered with the polyimide film 10 as shown in FIG. 2(b).

Figure 7:
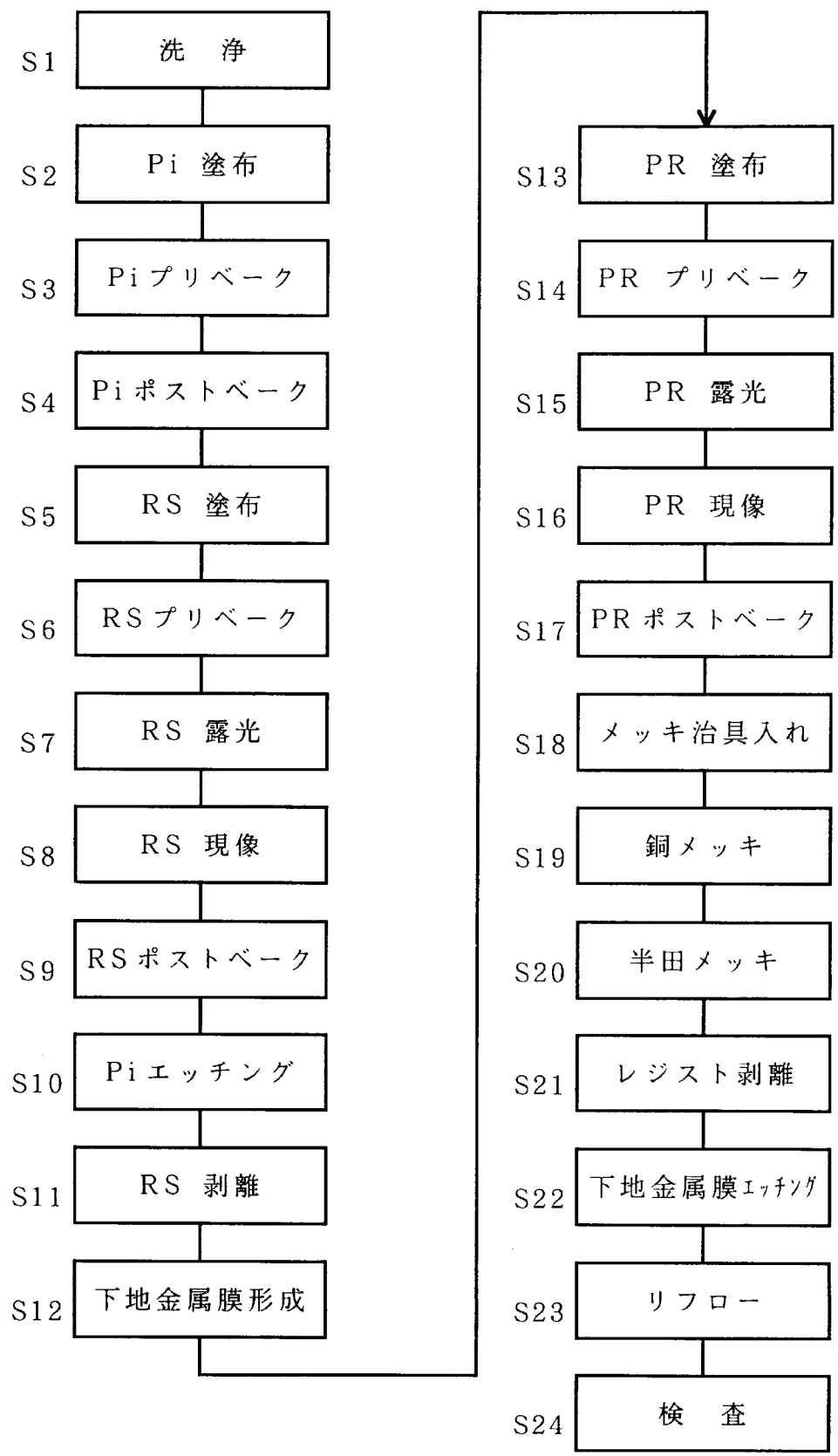
FIG. 7 shows a process chart of the conventional method for forming a bump and FIG. 8(a) through (j) show cross sectional views of bump forming portions of the major steps in FIG. 7.
Figure 8:
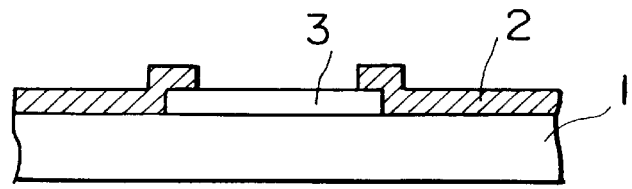
Figure 8:
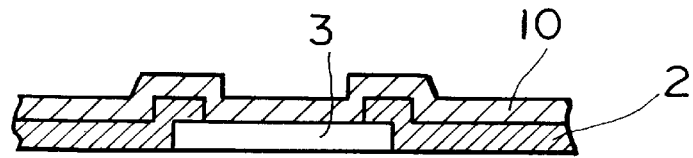
Figure 8:
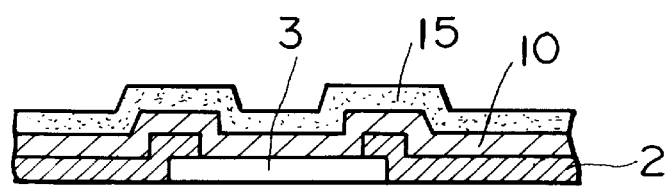
Figure 8:
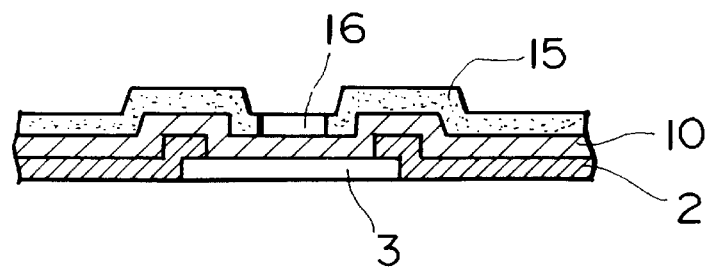
Figure 8:
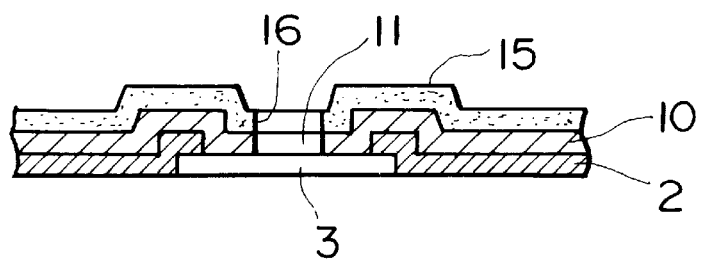
Figure 8:
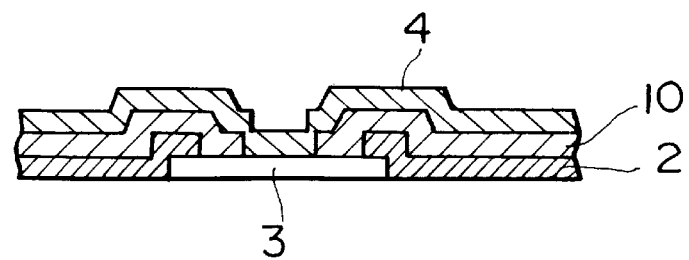
Figure 8:
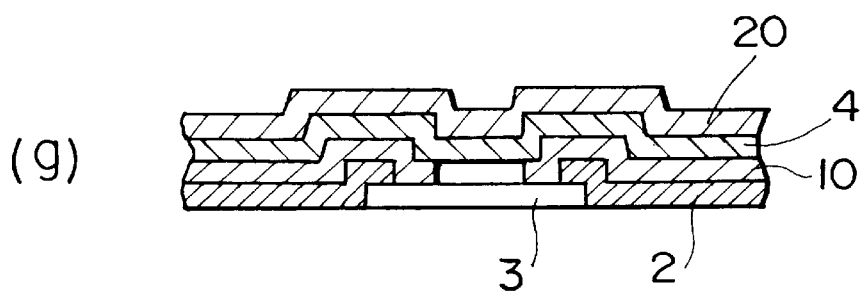
Figure 8:
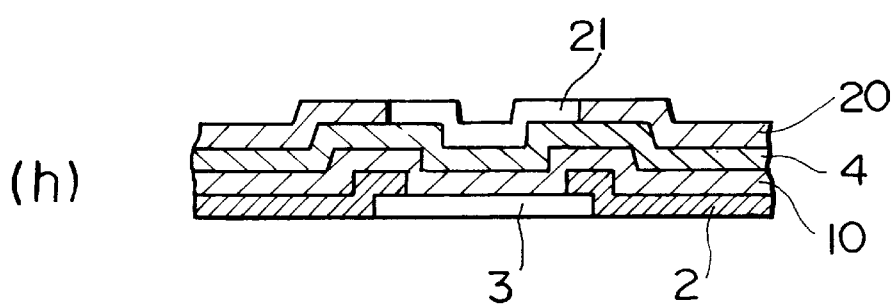
Figure 8:
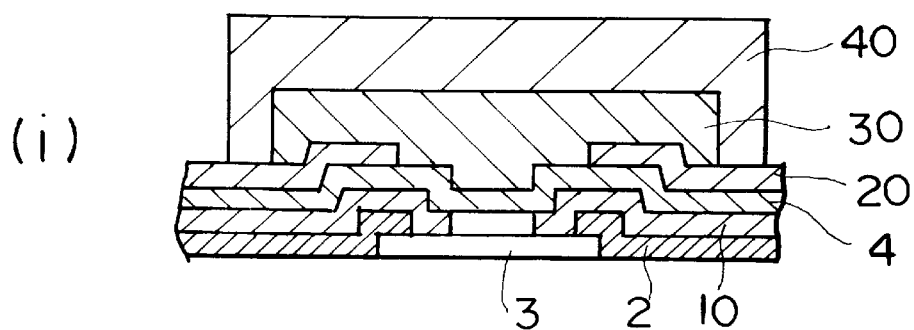
Figure 8:
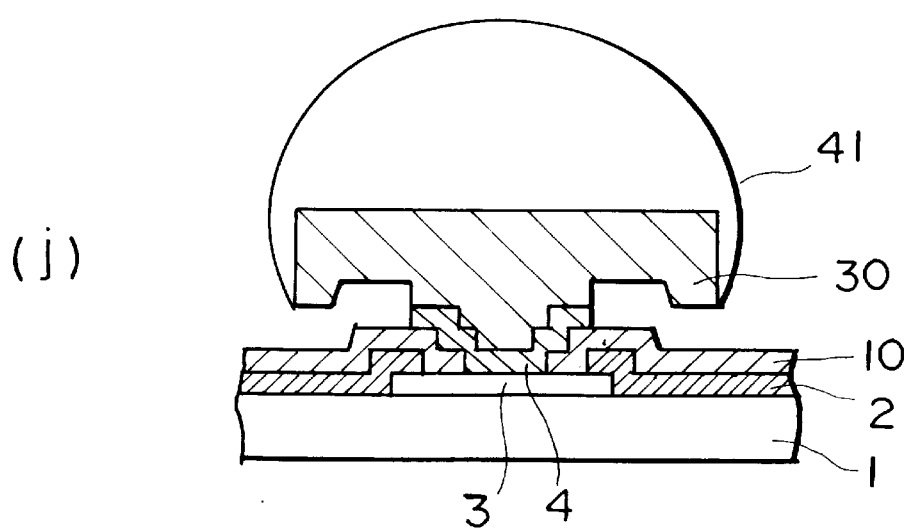

The steps S101 through S103 are the same as those corresponding to the steps of the conventional method for forming a bump as shown in FIG. 7 and FIGS. 8(a) and 8(b).

Next, in the polyimide opening forming step (S104), a portion of the polyimide film 10, which was formed by the coating step, drying step and post-baking step and which is substantially corresponding to the aluminum electrode 3, is removed by using an excimer laser beam 50. Then, the opening 11 of the polyimide film is formed on the aluminum electrode 3 as shown in FIG. 2(c).

Since an excimer laser beam 50 irradiates a high power light at a range of near ultra violet (wave length:193~350 nm), the photons have an high energy enough to cut the basic bonds such as C—H bonds and C—C bonds. Therefore, an exposure of an excimer laser beam can cut inter-molecular bonds of the organic film, decompose the organic film into carbon dioxides and vapor, eliminate the organic film and therefore, the opening can be formed. In order to irradiate the excimer laser beam only to the portion of the polyimide film 10 corresponding to the aluminum electrode 3, a mask (no illustration) is inserted between the laser beam 50 and the semiconductor wafer, and the mask is projected onto the semiconductor wafer by using an optical system.

In the following, an example for forming the opening 11 of the polyimide film 10 by using an excimer laser beam 50 will be described.

On the completed semiconductor wafer, polyimide PIX-1400 (HITACHI KASEI KOUGYOU Co. LTD) is coated as a polyimide resin with 2.0 $\mu$m in thickness, and the polyimide film is dried and post-baked. Thereafter, the opening 11 of the polyimide film, which has 100×100 $\mu$m$^2$ in area, is formed inside of a recess portion 3', which corresponds to the aluminum electrode 3. As the excimer laser beam, 30 pulses of KrF excimer laser beam (wave length:248 nm) of 0.23 J/cm$^2$ energy density are employed. Consequently, there is no degradation on the portion of the aluminum electrode 3 of about 1.0 $\mu$m thickness where the polyimide film is removed.

After the polyimide opening forming step (S104), in the step for forming the under bump metallurgy (S105), aluminum, chrome and copper are deposited by using a vacuum evaporation method and thereby a the under bump metallurgy 4 of the bump is formed as shown in FIG. 2(d). The under bump metallurgy 4 also has the function as a common electrode of electrolyte plating.

Next, in the photoresist coating step (S106), as shown in FIG. 2(e), a photoresist for plating(PR), which has the function as a mask of the electrolyte plating, is coated by using a spinner. Thereafter, in the post-baking step (S107) of the photoresist for plating(PR), a heat treatment at 140° C. for 30 min. is carried out in order to protect from a plating solution. The steps S105 through S107 are the same as those corresponding steps of the conventional method for forming a bump.

Next, in the opening forming step (S108) of the photoresist for plating, a portion of the photoresist for plating corresponding to the opening 11 of the polyimide, is exposed with an excimer laser beam 50. Consequently, the portion of the photoresist for plating film 20 is removed and the opening 21 is formed as shown in FIG. 2(e).

In the following, an example for forming the opening 21 of the photoresist film for plating 20 by using an excimer laser beam 50 will be described. On the under bump metallurgy 4, OMR-83 (TOKYO OHKA KOUGYOU Co, LTD.) is coated as a photoresist film for plating 20 with 3.5 $\mu$m in thickness, dried and post-baked. Thereafter, the opening 21 of the photoresist for plating, which is 150×150 g m$^2$ in area, is formed in a portion substantially corresponding to the recess portion 4' of the under bump metallurgy 4. As the excimer laser beam, 20 pulses of KrF excimer laser beam (wave length:248 nm) of 0.425 J/cm$^2$ energy density, are employed. Consequently, there is no degradation on the portion of the under bump metallurgy 4 of about 1.0 $\mu$m thickness where the photoresist film for plating 20 is removed.

In both of the polyimide opening forming step (S103) and the photoresist opening forming step (S107), the same instrument of the excimer laser is favorably used.

As for the following steps, such as the attaching to plating equipment step (S109) through the inspection step (S115), the steps corresponding to the conventional method for forming a bump can be carried out in the same manners.

First, according to the present method for forming a bump, it is possible to eliminate the quality deterioration of the bump by controlling the excimer laser power in the appropriate level in the etching step and by removing of the residue of polyimide, which is left in the periphery of the opening of polyimide on the aluminum electrode after the post-baking step, and which can not be taken off by the conventional photolithography technique.

Second, the number of steps, which is needed to form the openings in the polyimide film and the photoresist for plating, is remarkably decreased, and therefore the process becomes simple. Especially, the remarkable advantage or merits can be obtained by using the same instrument of the excimer laser in the both steps for forming the polyimide opening (S103) and for forming the photoresist opening (S107).

Third, due to the first and second advantages, it is possible to provide the method for forming a bump wherein the process cost is cheap and the total steps(time) is short.

Embodiment 2

Next, the Embodiment 2 of the present invention will be described with reference to FIG. 3 and FIGS. 4(a)–(g).

According to Embodiment 2, an under bump metallurgy is formed by electroless plating method and a solder bump is formed by an adhesive applying method.

The washing step (S201) through the polyimide opening forming step (S204) are the same as those of the Embodiment 1(S101~104).

Figure 4:
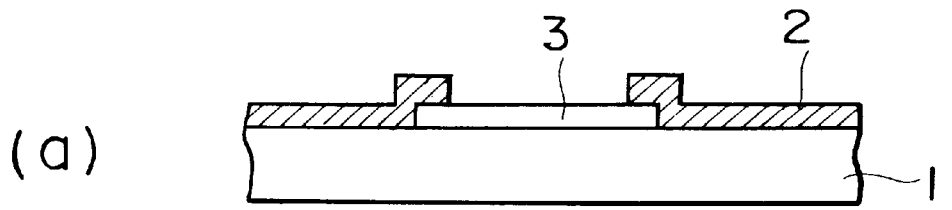
FIG. 4(a) through (g) show cross sectional views of bump forming portions of the major steps in FIG. 3.
Figure 4:
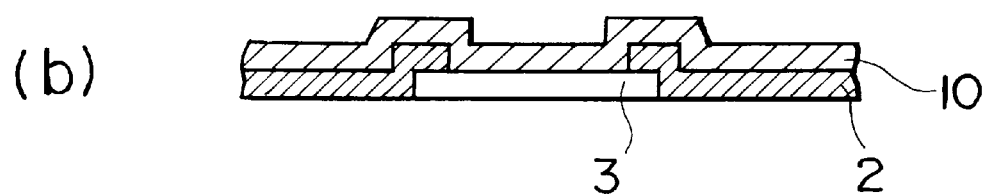
Figure 4:
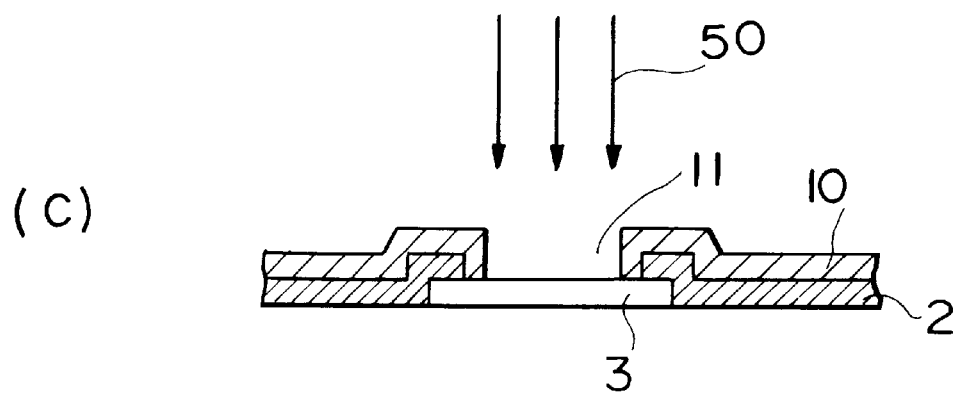
Figure 4:
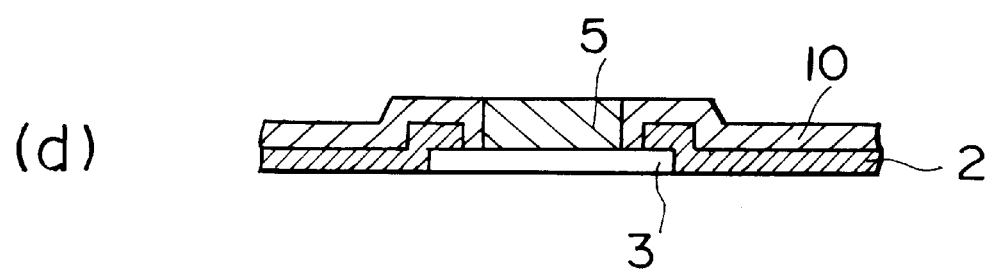
Figure 4:
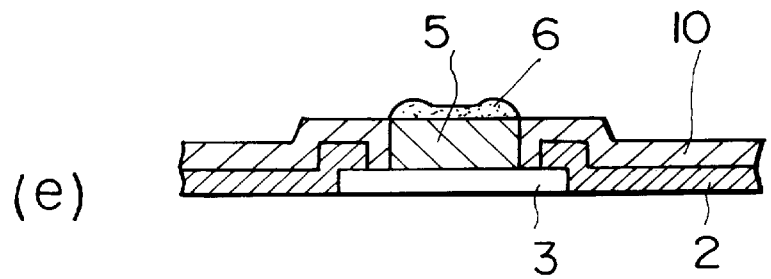
Figure 4:
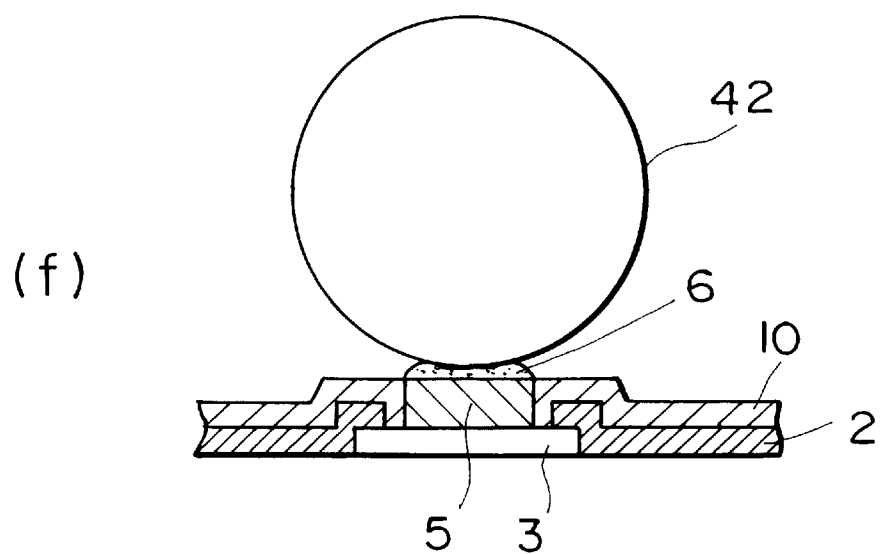
Figure 4:
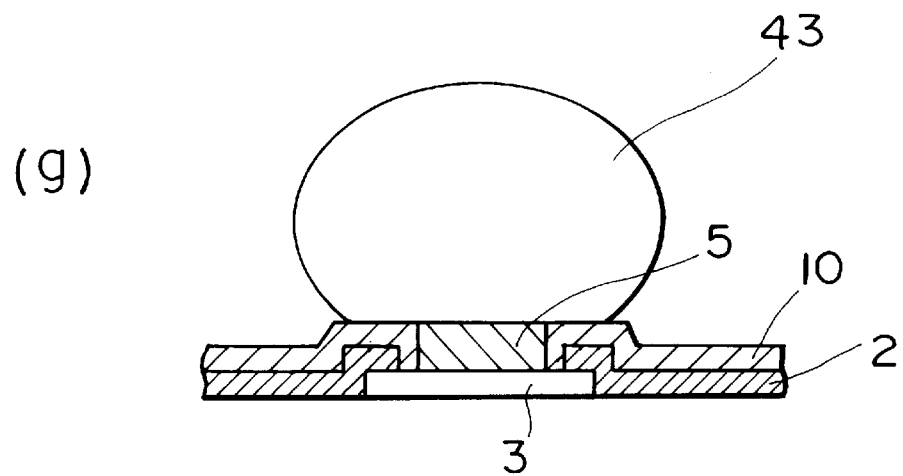
Figure 5:
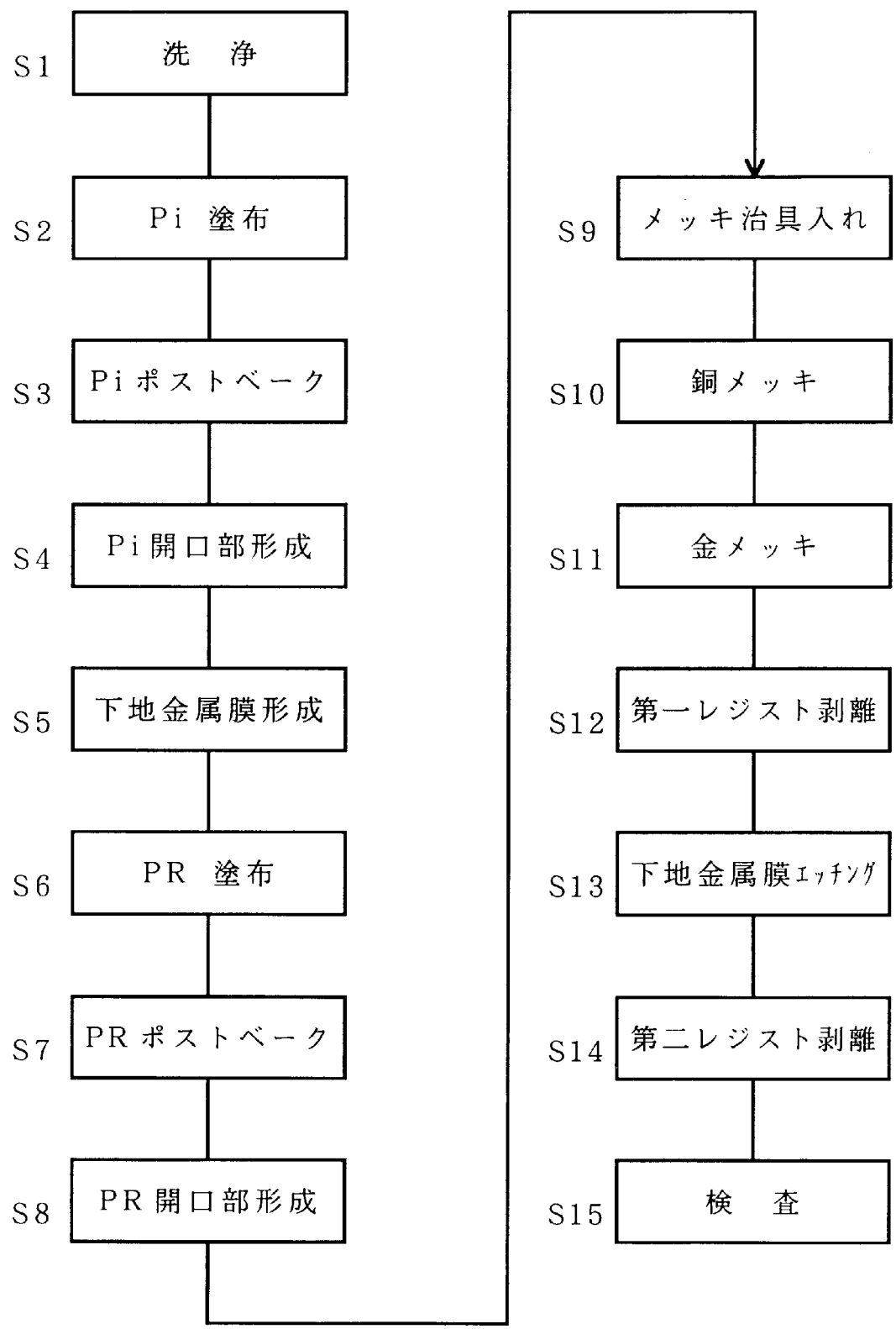
FIG. 5 shows a process chart of the method for forming a bump of Embodiment 4.

Next, in the forming step of the under bump metallurgy (S205), 2 μm of a nickel film 5 is plated by the electroless plating method on the aluminum electrode 3 through the polyimide(PI) opening 11 as shown in FIG. 4(d). Thereafter, in the adhesive application step(S206), an adhesive layer 6 is formed on the nickel film 5 selectively as shown in FIG. 4(e). Thereafter, in solder ball attachment step (S207), solder balls 42 are scattered onto the semiconductor wafer and thereby a solder grain 42 is adhered only to the adhesive layer 6 as shown in FIG. 2(f). Thereafter, the solder reflow step (S208) and the inspection step (S209), which are the same as those of the Embodiment 1(S114~115), is carried out and thereby a solder bump 43 is formed.

According to this embodiment 2, a further advantage such that a step for forming a bump becomes simpler, can be obtained.

Embodiment 3

Next, the Embodiment 3 of the present invention will be described.

According to the Embodiment 3, the polyimide coating step (S102) through the polyimide opening forming step (S104) are omitted from the steps described in the Embodiment 1 and other steps are remained. An under bump metallurgy 4 is formed directly on the passivation film 2 in the same manner as disclosed in the Embodiment 2. Further, the photoresist film for plating is removed by irradiating an excimer laser beam 50 in the same manner as disclosed in the Embodiment 2 and thereby an opening 21 of the photoresist film for plating is formed.

Embodiment 4

Finally, the Embodiment 4 of the present invention will be described with reference to FIG. 5 and FIGS. 6(a)–6(c).

In the Embodiment 4, the gold is used in place of solder plating. The washing step (S401) through the copper plating step (S410) are the same as the corresponding steps of the Embodiment 1 (S101~S110).

Figure 6:
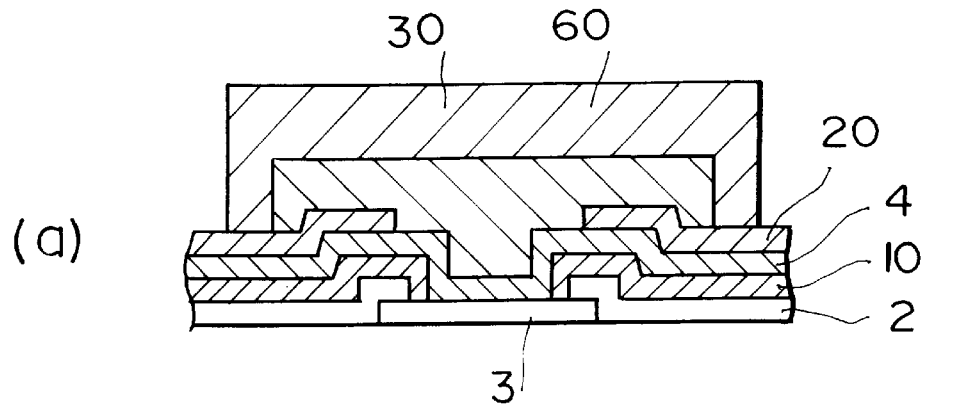
FIG. 6(a) through (c) show cross sectional views of bump forming portions of the main steps in FIG. 5.
Figure 6:
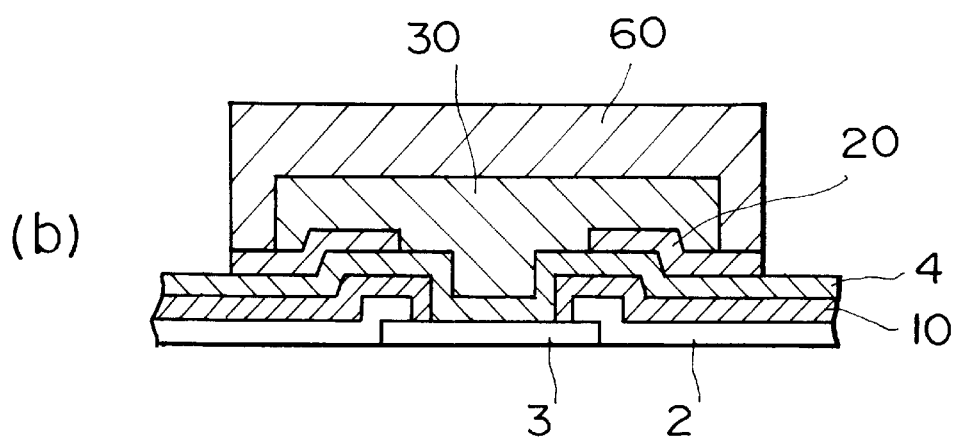
Figure 6:
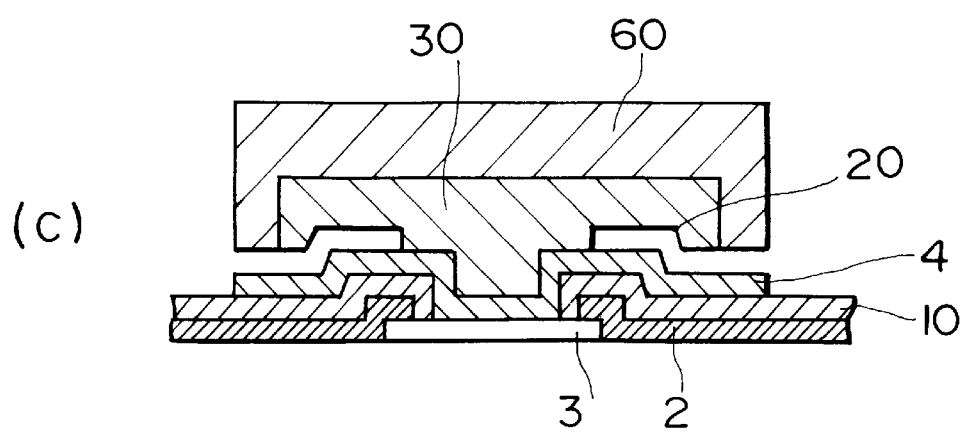

According to this embodiment, in the gold plating step (S411), a surface of the plated copper 30 is further plated with gold 60. Thereafter, in the first resist removal step (S412), the photoresist film for plating 20 is exposed with the excimer laser beam as shown in FIG. 6(a) and thereby a portion of the photoresist film for plating, where gold is not plated, is removed as shown in FIG. 6(b). Thereafter, in the etching step of the under bump metallurgy (S413), the metallurgy 4 is etched by using gold 60 and the photoresist film 20 under copper 30 and gold 60 as a mask.

Next, in the second resist removal step (S414), the photoresist film for plating 20 under the copper 30 and gold 60 is removed by using a resist removing agent as shown in FIG. 6(c). Thereafter, in the inspection step, an inspection is carried out.

According to the Embodiment 4, since an etching of the under bump metallurgy 4 is not made under the bump by the presence of the photoresist film 20 for plating just under copper 30, gold 60 and the etching control is easy. In addition, since good uniformity of the etching can be obtained, the etching margin becomes smaller and bumps with higher density can be obtained.

What is claimed is:

1. A method for forming a bump on a semiconductor wafer which has a pad electrode thereon, comprising;

a step for coating an organic film on a semiconductor wafer;

a step for drying said organic film;

a step for applying an excimer laser to a portion of said organic film substantially corresponding to a pad electrode on the semiconductor wafer to thereby form an opening in the organic film; and a step of providing and melting solder at the opening to form a solder bump.

2. The method according to claim 1, wherein said organic film is a polyimide film.

3. The method according to claim 1, wherein said organic film is a photoresist film for plating.

4. The method according to claim 3, wherein said photoresist film for plating is removed by using the excimer laser after the bump is formed on the pad electrode.

5. A method for forming a bump on a semiconductor wafer which has a pad electrode thereon, comprising;

a step for coating a first organic film on a semiconductor water;

a step for drying said first organic film;

a step for applying an excimer laser to a portion of said first organic film substantially corresponding to the pad electrode to thereby form a first opening in the organic film;

a step for forming at least one metallic film on said first organic film and said opening;

a step for coating a second organic film on said metallic film;

a step for drying said second organic film;

a step for applying an excimer laser to a portion of said second organic film substantially corresponding to said first opening to thereby form a second opening in the second organic film; and a step of providing and melting solder at the second opening to form a solder bump.

6. The method according to claim 5, wherein said first organic film is a polyimide film and said second organic film is a resist film for plating.

7. The method according to claim 5, wherein said resist film for plating is removed by using the excimer laser after the bump is formed on the pad electrode.

8. The method according to claim 1, wherein said excimer laser cuts inter-molecular bonds of the organic film, and decomposes the organic film into carbon dioxides and vapor to eliminate the organic film.

9. The method according to claim 1, wherein when the excimer laser is applied to the semiconductor wafer, a mask is inserted between a laser beam and the semiconductor wafer, said mask being projected onto the semiconductor wafer by an optical system.

10. The method according to claim 5, wherein each of said excimer laser cuts inter-molecular bonds of each of the organic films, and decomposes each of the organic films into carbon dioxides and vapor to eliminate the organic films.

11. The method according to claim 5, wherein when the excimer laser is applied to the semiconductor wafer, a mask is inserted between a laser beam and the semiconductor wafer, said mask being projected onto the semiconductor wafer by an optical system.

12. The method according to claim 5, wherein the excimer laser used for forming the first opening and the excimer laser used for forming the second opening are same.

13. The method according to claim 6, wherein the excimer laser used for forming the first opening and the excimer laser used for forming the second opening are same.

14. The method according to claim 7, wherein the excimer laser used for forming the first opening and the excimer laser used for forming the second opening are same.

* * * * *

UNITED STATES PATENT AND TRADEMARK OFFICE
CERTIFICATE OF CORRECTION

PATENT NO. : 5,946,590
DATED : Aug. 31, 1999
INVENTOR(S) : Tetsuo Satoh

It is certified that error appears in the above-identified patent and that said Letters Patent is hereby corrected as shown below:

The title page, should be deleted to be replaced with the attached title page.

The drawing sheets, consisting of Figs. 1, 3, 5 and 7, should be deleted to be replaced with the drawing sheets, consisting of Figs. 1, 3, 5 and 7, as shown on the attached pages.

Signed and Sealed this

Thirtieth Day of May, 2000

Attest:

Q. TODD DICKINSON

Attesting Officer

Director of Patents and Trademarks

United States Patent [19]
Satoh

[11] Patent Number: 5,946,590
[45] Date of Patent: Aug. 31, 1999

[54] METHOD FOR MAKING BUMPS

[75] Inventor: Tetsuo Satoh, Tokyo, Japan

[73] Assignee: Citizen Watch Co., Ltd., Tokyo, Japan

[21] Appl. No.: 08/987,240

[22] Filed: Dec. 9, 1997

[30] Foreign Application Priority Data

Dec. 10, 1996 [JP] Japan ................................ 8-329496

[51] Int. Cl.$^6$ ................................................ H01L 21/44
[52] U.S. Cl. ........................ 438/613; 438/612; 438/614
[58] Field of Search ................................ 438/613, 612, 438/614

[56] References Cited

U.S. PATENT DOCUMENTS

| | | | |
|---|---|---|---|
| 4,950,623 | 8/1990 | Dishon | 438/615 |
| 5,137,845 | 8/1992 | Lochon et al. | 438/614 |
| 5,376,584 | 12/1994 | Agarwala | 438/615 |

Primary Examiner—Kevin M. Picardat
Assistant Examiner—Deven Collins
Attorney, Agent, or Firm—Kanesaka & Takeuchi

[57] ABSTRACT

A bump is formed on a semiconductor wafer which has a pad electrode thereon. The method includes the steps for coating a first organic film on a semiconductor wafer; drying the first organic film; applying an excimer laser to a portion of the first organic film substantially corresponding to the pad electrode to thereby form a first opening in the organic film; forming at least one metallic film on the first organic film and the opening; coating a second organic film on the metallic film; drying the second organic film; applying an excimer laser to a portion of the second organic film substantially corresponding to the first opening to thereby form a second opening in the second organic film; and providing and melting solder at the second opening to form a solder bump. Since the openings of the organic films are formed by the excimer laser, the openings can be formed in a short time with high accuracy. Thus, the bump with high quality can be formed at a low cost.

14 Claims, 11 Drawing Sheets

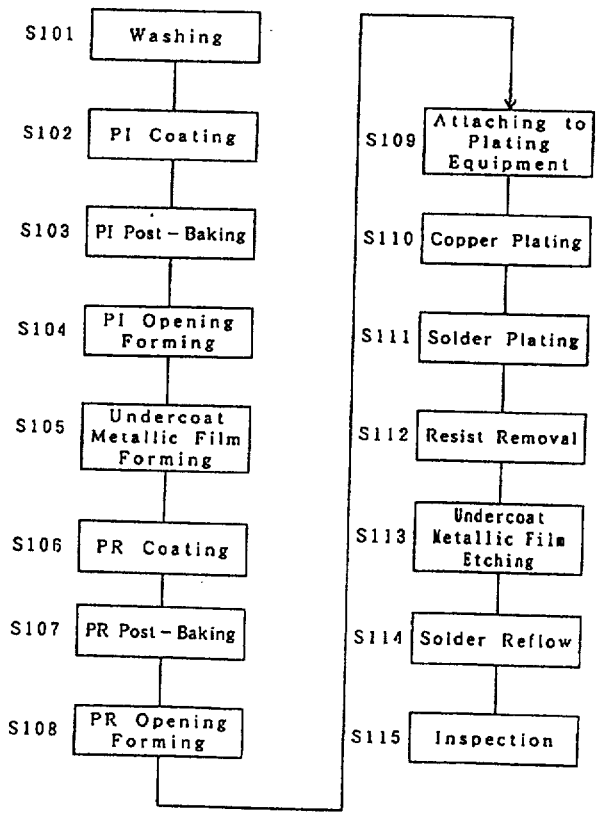

UNITED STATES PATENT AND TRADEMARK OFFICE
CERTIFICATE OF CORRECTION

PATENT NO : 5,946,590
DATED : August 31, 1999
INVENTOR(S) : Tetsuo Satoh

It is certified that error appears in the above-identified patent and that said Letters Patent are hereby corrected as shown below:

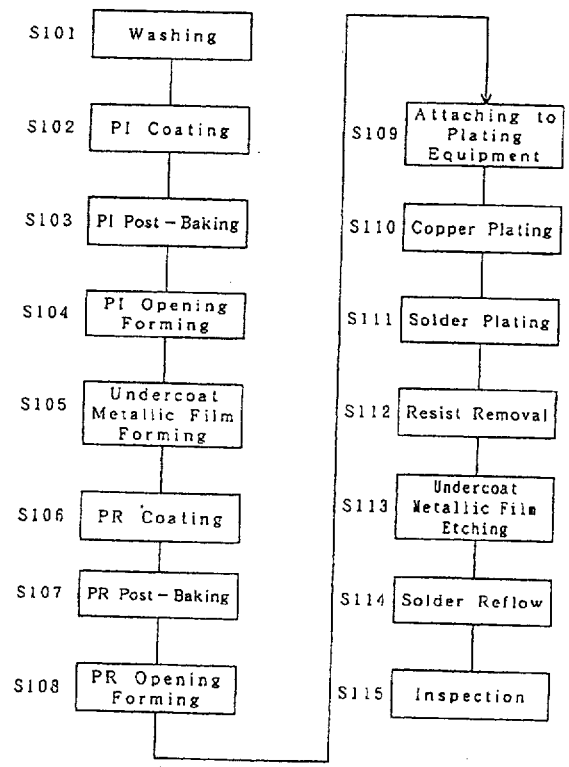

Fig. 1

UNITED STATES PATENT AND TRADEMARK OFFICE
CERTIFICATE OF CORRECTION

PATENT NO : 5,946,590
DATED : August 31, 1999
INVENTOR(S) : Tetsuo Satoh

It is certified that error appears in the above-identified patent and that said Letters Patent are hereby corrected as shown below:

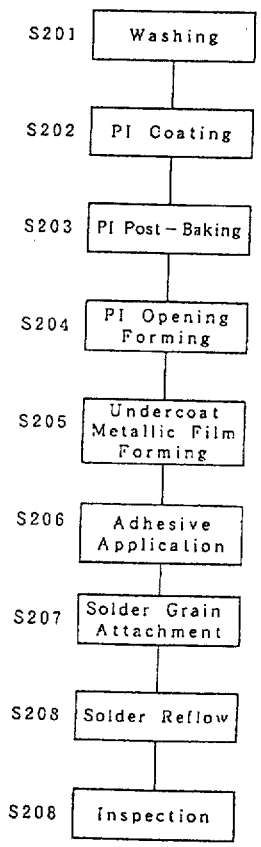

Fig. 3

UNITED STATES PATENT AND TRADEMARK OFFICE
CERTIFICATE OF CORRECTION

PATENT NO : 5,946,590
DATED : August 31, 1999
INVENTOR(S) : Tetsuo Satoh

It is certified that error appears in the above-identified patent and that said Letters Patent are hereby corrected as shown below:

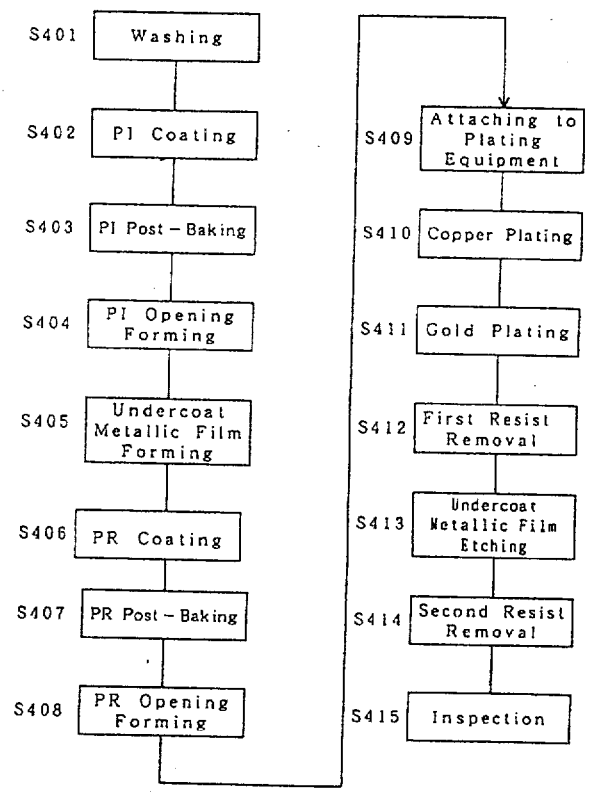

Fig. 5

UNITED STATES PATENT AND TRADEMARK OFFICE
CERTIFICATE OF CORRECTION

PATENT NO : 5,946,590
DATED : August 31, 1999
INVENTOR(S) : Tetsuo Satoh

It is certified that error appears in the above-identified patent and that said Letters Patent are hereby corrected as shown below:

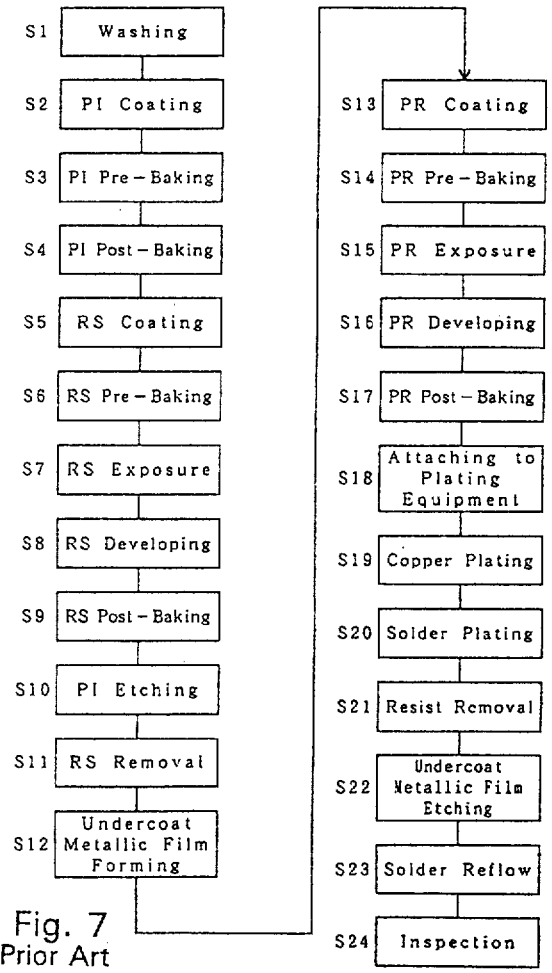

Fig. 7
Prior Art